United States Patent
Rhodes et al.

(10) Patent No.: US 6,759,324 B1
(45) Date of Patent: Jul. 6, 2004

(54) METHOD OF FORMING A LOW RESISTANCE CONTACT TO UNDERLYING ALUMINUM INTERCONNECT BY DEPOSITING TITANIUM IN A VIA OPENING AND REACTING THE TITANIUM WITH THE ALUMINUM

(76) Inventors: Howard E. Rhodes, 631 E. Ridgefield Dr., Boise, ID (US) 83706; Sanh Tang, 1273 N. Jullion Ave., Boise, ID (US) 83704

( * ) Notice: Subject to any disclaimer, the term of this patent is extended or adjusted under 35 U.S.C. 154(b) by 0 days.

(21) Appl. No.: 09/711,270

(22) Filed: Nov. 13, 2000

Related U.S. Application Data

(62) Division of application No. 09/145,437, filed on Sep. 2, 1998, now Pat. No. 6,274,486.

(51) Int. Cl.[7] ...................... H01L 21/4763; H01L 21/44
(52) U.S. Cl. ........................................ 438/628; 438/688
(58) Field of Search ................................ 438/640, 688, 438/627, 628, 643, 644, 648, 656, 685

(56) References Cited

U.S. PATENT DOCUMENTS

| | | | |
|---|---|---|---|
| 4,271,424 A | 6/1981 | Inayoshi et al. ............... 357/67 |
| 4,592,802 A | 6/1986 | Deleonibus et al. ......... 156/644 |
| 4,619,038 A | 10/1986 | Pintchovski .................. 29/590 |
| 4,666,737 A | 5/1987 | Gimpelson et al. .......... 438/629 |
| 4,698,244 A | 10/1987 | Benander et al. ............ 427/253 |
| 4,792,842 A | 12/1988 | Honma et al. ............... 257/763 |
| 4,923,526 A | 5/1990 | Harada et al. ................. 148/6 |
| 4,967,259 A | 10/1990 | Takagi ......................... 357/68 |
| 4,999,160 A | 3/1991 | Lowrey et al. .............. 420/529 |
| 5,147,819 A | 9/1992 | Yu et al. ...................... 438/662 |
| 5,200,359 A * | 4/1993 | Pearey et al. ................ 438/629 |
| 5,204,286 A | 4/1993 | Doan .......................... 438/618 |
| 5,225,372 A | 7/1993 | Savkar et al. ................ 438/653 |
| 5,309,023 A | 5/1994 | Motanami et al. ........... 257/753 |
| 5,354,417 A | 10/1994 | Cheung et al. .............. 156/643 |
| 5,356,836 A * | 10/1994 | Chen et al. ............. 204/192.17 |
| 5,358,901 A | 10/1994 | Fiordalice et al. ........... 438/648 |
| 5,371,042 A * | 12/1994 | Ong ............................. 438/653 |
| 5,376,573 A | 12/1994 | Richart et al. ............... 438/258 |
| 5,385,867 A | 1/1995 | Ueda et al. .................. 438/620 |
| 5,416,431 A | 5/1995 | Strauss |
| 5,484,741 A | 1/1996 | Begemont |
| 5,488,014 A * | 1/1996 | Harada et al. ............... 438/625 |

(List continued on next page.)

FOREIGN PATENT DOCUMENTS

EP          0 661736 A1       7/1995

OTHER PUBLICATIONS

Van Zant, Microchip Fabrication, 4th ed. McGraw–Hill: New York, 1984, p. 199.*

(List continued on next page.)

Primary Examiner—Erik J. Kielin

(57) ABSTRACT

Structures and processes are disclosed for reducing electrical contact resistance between two metal layers. Specifically, a resistive aluminum oxide layer forms spontaneously on metal lines including aluminum, within a V-shaped contact via which is opened in an insulating layer through a mask. The mask includes an opening with a width of less than about 0.75 μm. After removing the mask, the via is treated with an RF etch. The resultant contact has a width at the bottom of less than 0.9 μm. A titanium layer of 300 Å to 400 Å is deposited into the via, with about 60 Å to 300 Å reaching the via bottom and reacted with the underlying aluminum. The reaction produces a titanium-aluminum complex (TiAl$_x$) with a thickness of about 150 Å to 900 Å. Advantageously, this composite layer provides a low resistivity contact between the aluminum-containing layer and a subsequently deposited metal layer.

15 Claims, 5 Drawing Sheets

U.S. PATENT DOCUMENTS

| | | | | |
|---|---|---|---|---|
| 5,514,247 A | | 5/1996 | Shan et al. | 438/700 |
| 5,545,289 A | | 8/1996 | Chen et al. | 438/694 |
| 5,552,341 A | * | 9/1996 | Lee | 257/740 |
| 5,589,412 A | | 12/1996 | Iranmanesh et al. | 438/257 |
| 5,635,763 A | * | 6/1997 | Inoue et al. | 257/763 |
| 5,661,083 A | | 8/1997 | Chen et al. | 438/637 |
| 5,730,835 A | | 3/1998 | Roberts et al. | 257/773 |
| 5,895,265 A | * | 4/1999 | Inoue et al. | 438/643 |
| 6,143,649 A | * | 11/2000 | Tang | 438/640 |
| 6,177,350 B1 | * | 1/2001 | Sundarrajan | 438/688 |
| 6,225,227 B1 | * | 5/2001 | Aizawa | 438/694 |
| 6,271,592 B1 | * | 8/2001 | Kim et al. | 257/751 |

OTHER PUBLICATIONS

Maissel, Leon and Glang, Reinhard; "Handbook of Thin Film Technology," 1970 by McGraw–Hill, Inc.; 3–9 to 3–14.*

Wolf, S. and R.N. Tauber, Silicon Processing for the VLSI Era—vol. 1—Process Technology; 1986 by Lattice Press; vol. 1 pp. 407–409.*

Nagwa et al., "Effects of the Second Metal Structure on Electromigration at Via Holes," abstract only (no translation), 27 P–E–11.

* cited by examiner

METHOD OF FORMING A LOW RESISTANCE CONTACT TO UNDERLYING ALUMINUM INTERCONNECT BY DEPOSITING TITANIUM IN A VIA OPENING AND REACTING THE TITANIUM WITH THE ALUMINUM

REFERENCE TO RELATED APPLICATION

The present application is a divisional of U.S. application Ser. No. 09/145,437, filed Sep. 2, 1998. Now U.S. Pat. No. 6,274,486.

BACKGROUND OF THE INVENTION

1. Field of the Invention

The present invention generally relates to semiconductor integrated device design and fabrication and, more particularly, to methods of manufacturing intermetal contacts for high-density dynamic random access memory arrays.

2. Description of the Related Art

In large scale semiconductor integrated circuit technology, the trend of increasing circuit density makes vertical circuit integration one of the critical aspects of current manufacturing processes. This is of particular relevance to the manufacture of multi-level interconnect structures (i.e., wiring). Large scale integrated semiconductor circuits can have multiple layers of electrically conductive films to interconnect various active device regions which are located on a semiconductor substrate. In the semiconductor industry, these conductive films are often referred to as lines or runners.

Aluminum has been the most widely used conductive material in the manufacture of semiconductor integrated circuits. The main reason for the pervasiveness of aluminum is its low resistivity (2.7 $\mu\Omega$-cm) and its good adhesion to $SiO_2$ and silicon. Additionally, the use of aluminum thin-films in multilevel metal systems is a well-understood process.

Modem devices generally have at least three layers of conductive lines in their vertical circuitry. Typically, the first layer is provided for local interconnections while the upper layers are generally provided for global interconnections (i.e., across the entire chip). The conductive lines at different elevations are normally separated from one another by an insulating interlevel dielectric, such as silicon dioxide. Interconnections between these conductive lines can be provided by metal-filled vias. Conventionally, vias are opened through the interlevel dielectric so as to expose a contact region on the underlying conductor. An upper conductive layer is connected to the lower conductive layer at this contact region.

FIG. 1A illustrates a typical prior art multilevel structure using two layers of conductive lines. This multilevel structure comprises a lower aluminum layer 106 which is deposited on a first interlevel dielectric 102 and within a contact opening 104. The lower aluminum layer fills the contact opening 104 and contacts an active area 103 on a substrate 101. A second interlevel dielectric 108 is typically used to isolate the lower aluminum layer 106 from an upper conductor layer 112, such as an aluminum or tungsten layer. The upper conductor layer 112 covers the second interlevel dielectric 108 and fills the via opening 107. The upper conductor layer 112 contacts the lower aluminum layer at a contact location 109 in the via opening 107. Finally, a top insulating layer 114 is deposited on the upper conductor layer 112.

As illustrated in FIG. 1A, the upper conductor layer 112 establishes electrical contact with the lower aluminum layer 106 at the contact location 109. In a semiconductor integrated circuit, the electrical resistivity of such contact locations is significant enough to influence overall speed and reliability of the semiconductor device. Ideally, the electrical resistivity of the via contact must be as low as possible. However, conventional contacts display an unacceptable level of high resistivity due to an aluminum oxide layer primarily forming on the lower aluminum layer, specifically at the contact location. The aluminum oxide forms spontaneously when the aluminum material is exposed to an oxidizing atmosphere. Although the thickness of the aluminum oxide layer is only 50 Å to 60 Å, the aluminum oxide produces an insulation barrier between the upper conductor and the lower aluminum layer, and greatly degrades the electrical contact between them, even in this thickness regime.

The aluminum layer will generally be exposed to an oxidizing atmosphere at some point in conventional fabrication process flows, causing an oxide layer to form on the aluminum. For example, referring to FIG. 1, an oxide layer (not shown) on the lower aluminum layer 106 may primarily form after the deposition of the lower aluminum layer 106 when the aluminum layer is exposed to air. Similarly, an oxide layer may form during deposition of the interlevel dielectric 108 when the surface of the aluminum layer is exposed to oxidizing gases during such deposition. Additionally, oxidation of the aluminum can occur during etch processes used for opening vias in interlevel dielectrics. In such processes, the via openings 107 can be etched using a variety of etching techniques such as wet etching, plasma etching and reactive ion etching. Once the interlevel dielectric 108 is removed from the via opening 107, the contact region 109 is exposed to the reactive etchant solutions or gases resulting in oxidation of the location 109.

One manner of reducing resistivity has been to deposit a layer of titanium before the deposition of the upper conductor layer. As illustrated in FIG. 1B, a layer of titanium 110 is deposited on a patterned and etched second interlevel dielectric (ILD) 108, prior to filling the via 107 with a second conductive layer 112. Conventionally, the titanium layer has been deposited using a sputter deposition technique to a thickness of greater than about 500 Å over the ILD 108 for contact dimensions on the order of about 1 $\mu$m. More recently, the titanium layer has been deposited to a thickness of about 200 Å for similar contact dimensions. In accordance with conventional scaling techniques, reduction of via opening dimensions and/or increasing aspect ratios would be compensated by increasing the amount of deposited titanium, such that adequate coverage of the via bottom is maintained.

As increasing circuit densities result in narrower and deeper via openings, adequate electrical connection through these deep and narrow openings becomes ever more important to the speed and reliability of the circuit. As the contact region gets smaller, the electrical resistivity levels provided by prior art processes become less satisfactory. Thus, there is a need for processes and structures for reducing resistivities in integrated circuit contacts.

SUMMARY OF THE INVENTION

The aforementioned needs are satisfied by the processes and structures disclosed herein, by which the electrical resistivity of an interlevel contact can be optimized.

In accordance with one aspect of the invention, a process is provided for forming low resistance contacts between conducting lines in an integrated circuit. The process involves forming a first metallic layer over a semiconductor substrate, and an insulating layer over a first surface of the metallic layer. A patterned mask is formed over the insulating layer, with an opening of an opening of less than about 0.75 μm. A contact via is then etched through the opening to expose a contact region of the first surface. The mask is removed, and a titanium layer deposited over the insulating layer and into the via. The titanium layer is deposited to a thickness between about 300 Å and 400 Å over the insulating layer.

In accordance with another aspect of the present invention, a method is provided for forming an integrated circuit with a low resistivity intermetal contact through an insulating layer. The method includes forming a first conductive layer, which includes aluminum, over a semiconductor substrate, and forming an insulating layer on an upper surface of the first conductive layer. A contact via of a selected size and shape is etched in the insulating layer to expose a contact region of the upper surface of the first conductive layer. Aluminum oxide forms on the first conductive layer, at least within the contact region. An amount of titanium required for 60 Å to 300 Å to reach the bottom of such a via is then determined, and this determined amount is deposited over the insulating layer. The titanium which reaches the via bottom is then reacted with the underlying aluminum, forming a composite material in the contact region. A second conductive layer is then deposited into the contact opening.

In accordance with another aspect of the present invention, an integrated circuit is provided with a first conductive layer, which includes aluminum, and an insulating layer adjacent the first conductive layer. A contact via extends through the insulating layer to the first conductive layer. The via has a width at the first conductive layer of less than about 0.76 μm. A composite layer, having about 150 Å to 900 Å of a titanium-aluminum complex, is formed in direct contact with the first conductive layer within the contact via. A second layer of conductive material is formed within the via in direct contact with the composite layer.

In accordance with yet another aspect of the present invention, a wiring structure in an integrated circuit is provided. The structure includes a first metal- layer, which includes aluminum, overlying a semiconductor substrate. A titanium-aluminum complex is formed in direct contact with the first metal layer across a contact region. The contact region is less than about 0.9 μm wide, while the complex is about 150 Å to 900 Å thick. An insulating layer overlies the first metal layer, except within the contact region, and a second metal layer overlies the insulating layer and directly contacts the titanium-aluminum complex.

BRIEF DESCRIPTION OF THE DRAWINGS

These and other aspects of the present invention will become more fully apparent from the following description taken in conjunction with the accompanying drawings, which are meant to illustrate and not to limit the invention, and wherein.

DETAILED DESCRIPTION OF THE PREFERRED EMBODIMENT

Reference will now be made to the drawings wherein like numerals refer to like parts throughout. As will be described below, the process of the present embodiment provides a method to form lower electrical resistivity via contacts.

As noted in the Background section above, conventional metal-to-metal contact structures tend to display high resistivities. The use of titanium layers within contacts has become more prevalent, and is believed to improve adhesion of metals within the contact structure. In the past, the chief concern with formation of the titanium layer has been to ensure adequate coverage of the contact region without forming keyholes during the deposition.

Applicants have determined, however, that reaction of the titanium layer 110 with the underlying aluminum layer 106 tends to produce defects, such as voids at the interface, after the titanium has been deposited. Specifically, a reaction of the titanium with the underlying aluminum produces a titanium-aluminum complex. The voids can also deteriorate the conductivity of the contact 109.

Figure 1A:
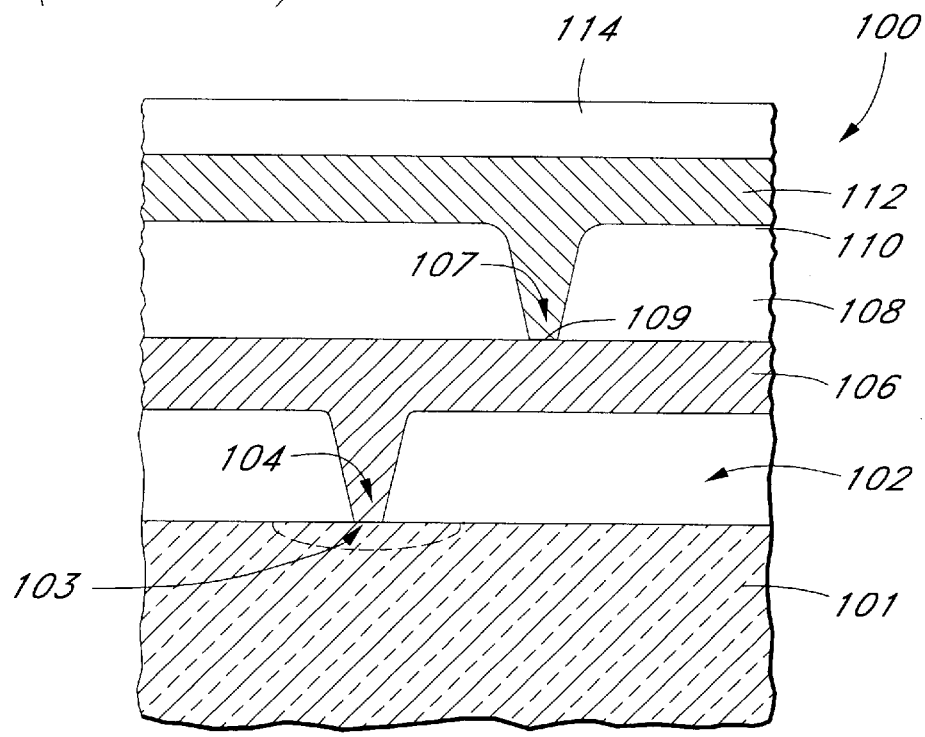
FIG. 1A is a schematic sectional view of an exemplary prior art multilevel semiconductor device.
Figure 1B:
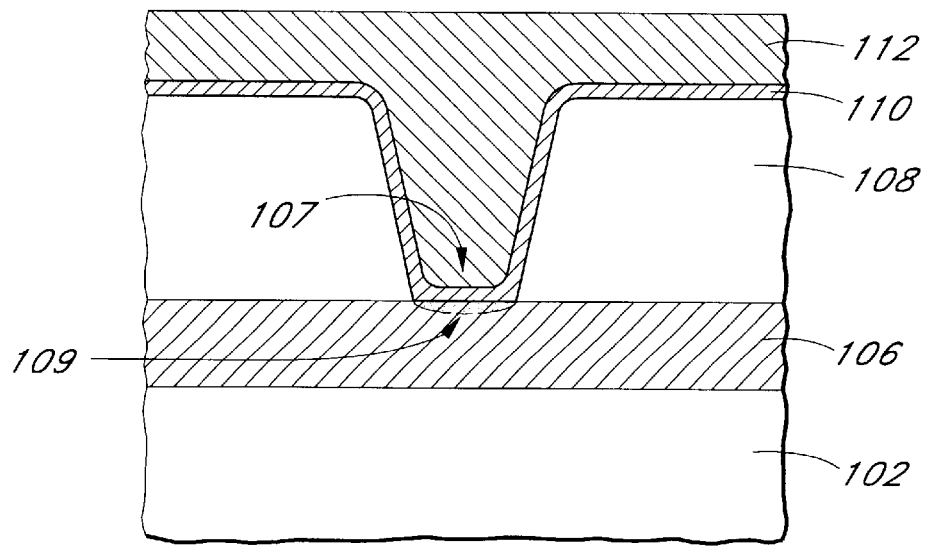
FIG. 1B is a schematic view of a wafer having titanium and aluminum layers formed in a contact opening.
Figure 2A:
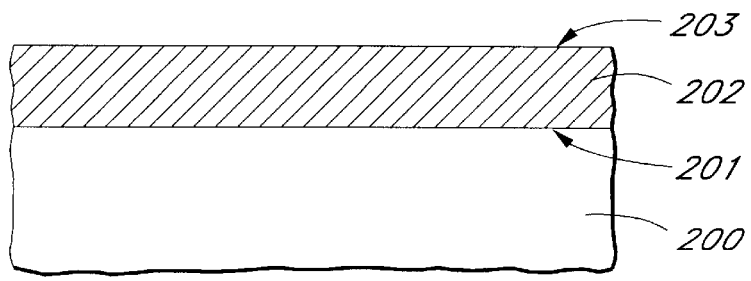
FIG. 2A is a schematic view of a portion of a wafer having an aluminum layer formed on top of a semiconductor substrate.

To address the above-noted concerns, Applicants have optimized a process for producing low resistivity metal-to-metal contacts in high-density integrated circuits, particularly contacts formed with mask openings of under about 0.75 μm. As illustrated in FIG. 2A, an aluminum layer 202 is initially formed on an upper surface 201 of a first insulating layer 200, which in turn overlies a semiconductor substrate (not shown). The semiconductor substrate has been partially fabricated with integrally formed transistors and capacitors, as will be readily appreciated by one of ordinary skill in the art.

The aluminum layer includes an upper surface 203. The first insulating layer 200 can comprise any of a number of known dielectric materials, and preferably comprises a form of silicon oxide, typically in a thickness of about 0.5 μm to 2.5 μm. The first insulating layer 200 may be formed using any of a number of techniques in the art, such as chemical vapor deposition (CVD) of borophosphosilicate glass (BPSG), or plasma-assisted tetraethylorthosilicate (TEOS) deposition.

The aluminum layer 202, often referred to as Metal 1, preferably comprises an aluminum alloy with a preferred composition range of 99.5% Al and 0.5% Cu. A preferred thickness range for this aluminum layer is about 0.2 μm to 1.0 μm, more preferably about 0.4 μm. The aluminum layer 202 is preferably sputter deposited on the first dielectric layer 200, as is known in the art.

Optionally, an anti-reflective layer (not shown), such as a thin layer of titanium nitride (TiN) coating, may be formed on a top surface 203 of the aluminum layer 202. This TiN layer can be as thick as 300 Å and reduces the reflectivity of the aluminum surface 203 during later process steps, as will be recognized by one of skill in the art. As is also known, TiN layers can be formed by sputter or CVD methods.

Figure 2B:
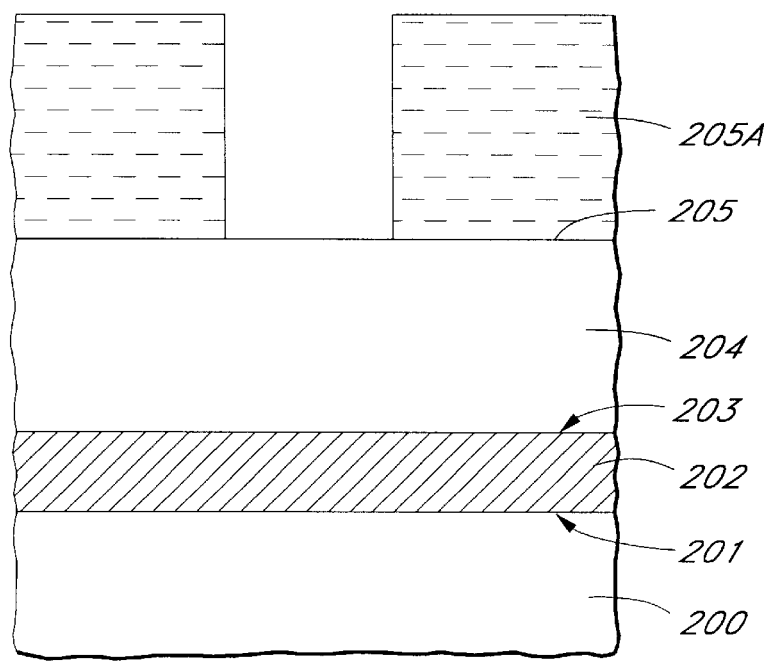
FIG. 2B is a schematic view of the wafer shown in FIG. 2A wherein an interlevel insulator has been formed on the aluminum layer.

As illustrated in FIG. 2B, a second insulating layer 204, preferably comprising a silicon dioxide (or simply "oxide") layer, is then formed on the top surface 203 of the aluminum layer 202. This second insulating layer 204 is often referred to as an interlevel dielectric and isolates the aluminum layer 202 from a subsequently deposited conductive layer (see FIG. 2E). A preferred thickness range for the second insulating layer 204 is about 0.4 µm to 0.8 µm, and more preferably about 0.5 µm.

After the second insulating layer 204 is formed, a mask layer 205A, preferably comprising photoresist, is deposited and patterned using conventional photolithographic techniques. The patterned mask 205A preferably defines openings with widths of less than about 0.75 µm, preferably less than about 0.65 µm, and more preferably less than about 0.55 µm.

Figure 2C:
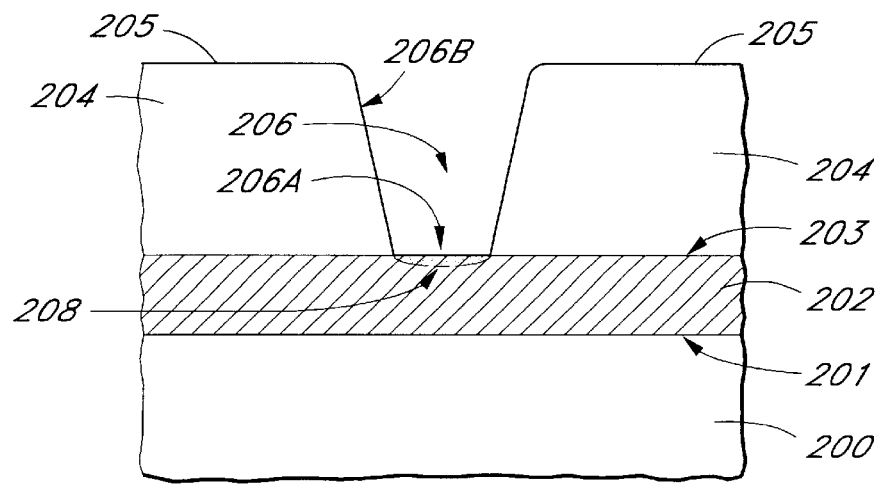
FIG. 2C is a schematic view of the wafer shown in FIG. 2B wherein a via opening has been etched through the interlevel insulator to expose a contact region on the aluminum layer.

Referring to FIG. 2C, mask formation is followed by etching of the interlevel insulator 204 through the mask to form a contact via or opening 206 which exposes a contact region 206A on the surface 203 of the aluminum layer 202. The via 206 preferably has an inwardly tapered shape having sloped sidewalls 206B terminating at the contact location 206A, as shown, such as can be obtained by exposing the masked and patterned insulating layer 204 to a relatively isotropic etch, such as a wet etch (e.g., HF). In the exemplary process, the via opened by a dry etch, in particular a $CHF_3$ and $CF_4$ plasma etch where the ratio of gases is chosen to minimize etch selectivity. As is known in the art, increasing the ratio of $CF_4$ in this plasma etch reduces selectivity, such that the resist mask is etched along with the oxide. This has the effect of not only sloping the sidewalls 206B, but also of widening the via 206 at both the top and the bottom.

It will be understood that the contact opening or via can also have vertical sidewalls by exposing the masked insulating layer to an anisotropic and/or selective etch, such as a $CHF_3$ and $CF_4$ plasma etch with higher ratios of $CHF_3$. It will further be understood, in light of the disclosure herein, that if an antireflection Tin layer covers the aluminum surface, the Tin layer can also be etched away from the contact region 206A.

The interlevel insulating layer 204 can be etched using any of the conventional etch techniques such as plasma etch, reactive ion etch or wet etch, depending upon the desired sloped or vertical sidewalls. As mentioned in the Background section, during or after such etching processes, the exposed aluminum metal of the contact region 206A is generally subjected to an oxidizing atmosphere which forms an electrically resistive aluminum oxide layer 208. The aluminum of the exposed contact region 206A is particularly subject to oxidation during an oxygen plasma strip of the photoresist after the via is etched. Typically, the aluminum oxide layer grows to a thickness range of 50–60 Å.

After the contact via 206 is formed and the photoresist mask stripped from the substrate, a post-opening etch is preferably performed on the substrate. The preferred physical etch comprises an RF etch, and particularly an argon plasma etch. The RF etch preferably reduces the aluminum oxide layer, and is performed in situ prior to the deposition step to follow. The physical etch also etches the interlevel insulator 204, and is preferably conducted until about 200 Å to 500 Å of the insulator 204 is removed. More preferably, about 350 Å of the oxide is etched. Preferred parameters include a bias of 250 V, with 220 W applied to the pedestal on which the substrate is mounted, and 300 W applied to the coil generating argon ions.

As a result of both the via etch and the post-opening physical etch, the contact via 206 is widened considerably relative to the width of the original mask opening (often referred to as the "critical dimension"). The widening effect at the upper or mouth portion of the contact via 206 is greater than at the bottom or contact region 206A of the via 206. Thus, for example, a mask opening of about 0.53 µm results in a width of about 1.0 µm at the mouth of the via 206, while the bottom 206A of the via 206 is widened to about 0.60 µm to 0.66 µm. A critical dimension or mask opening of about 0.63 µm leads to the mouth of the via 206 having a width of about 1.1 µm and a contact region 206A of about 0.70 µm to 0.76 µm. A mask opening of about 0.72 µm leads to via mouth of about 1.2 µm to 1.3 µm and a contact region 206A of about 0.85 µm to 0.90 µm. The preferred process, applied in conjunction with the preferred mask dimensions, thus results in a contact region 206A width of less than about 0.9 µm, preferably less than about 0.76 µm, and more preferably less than about 0.66 µm. The mouth of the via 206, on the other hand, widens to between about 1.0 µm to 1.3 µm.

Figure 2D:
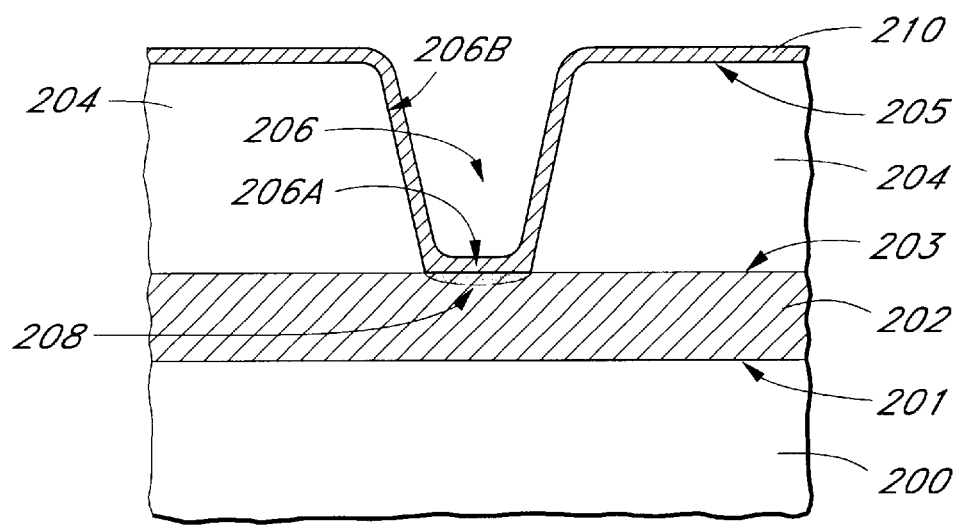
FIG. 2D is a schematic view of the wafer shown in FIG. 2C wherein a thin layer of titanium metal has been deposited on the interlevel insulator and within the contact region.

As illustrated in FIG. 2D, a titanium layer 210 is then deposited over the second or interlevel insulating layer 204 and into the contact via 206. Preferably, the titanium is deposited by physical vapor deposition (PVD), most preferably by sputter deposition.

As will be understood by one skilled in the art, the thickness of deposited material in the contact region 206A at the bottom of the via 206 will generally be less than the deposited amount. Preferably, enough titanium is deposited to form 60 Å to 300 Å over the contact region 206A (at the via bottom), more preferably about 70 Å to 180 Å. While lesser amounts of titanium can produce good contact resistivity, the given lower limits to deposited thicknesses are desirable to maintain consistently reproducible results and ensure adequate coverage of the contact area to break up residual aluminum oxide.

In accordance with the preferred embodiment, the titanium layer 210 is deposited to a thickness selected to result in the above-noted titanium amounts on the via bottom or contact region 206A. By convention, the deposited thicknesses are often discussed above in terms of the amount of titanium which will form on the exposed top surface of the second insulating layer 204, since that represents the parameter set by the integrated circuit manufacturer. The resultant amount in the contact region 206A at the via bottom, however, depends upon the amount of titanium deposited on the surface and the size of via 206. For example, if the via 206 is formed by a mask with an opening width of about 0.9 µm, a titanium thickness of between about 150 Å and 250 Å results in the desired amount titanium at the via bottom.

As noted above, however, the illustrated via 206 is formed with a mask critical dimension of less than about 0.75 µm (giving lower contact dimensions of less than about 0.9 µm after the preferred etches), preferably less than about 0.65 µm, and more preferably less than about 0.55 µm. For forming 60 Å to 300 Å of titanium at the bottom of such vias, the titanium layer 210 is preferably sputtered to a thickness between about 300 Å and 400 Å, more preferably about 325 Å to 375 Å.

Figure 2E:
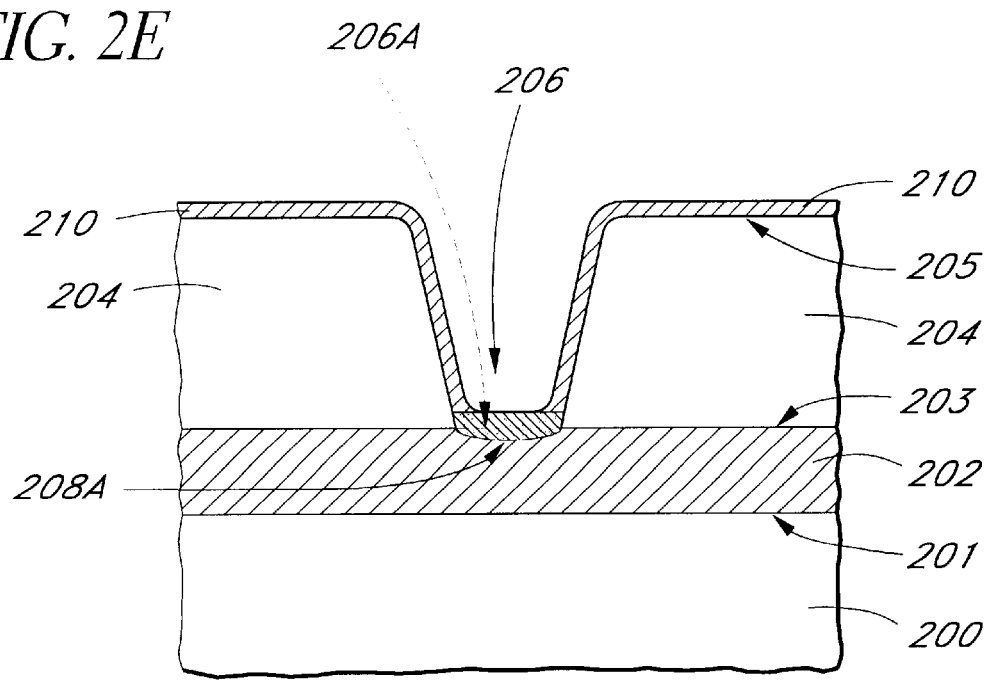
FIG. 2E is a schematic view of the wafer shown in FIG. 2D wherein a conductive composite layer has been formed on the contact region.

With reference to FIG. 2E, during deposition and subsequent high temperature steps, the titanium layer 210 reacts in the contact region 206A with the underlying aluminum layer 202. Titanium thus reacts with aluminum and produces a highly conductive titanium-aluminum composite layer 208A, preferably of the form TiAl$_x$, and in particular TiAl$_3$. As the reaction proceeds, the titanium layer 210 within the contact region 206A is consumed. In accordance with the preferred range of titanium thickness and contact dimension, the thickness of the composite layer 208A is preferably between about 150 Å and 900 Å, more preferably between about 200 Å and 600 Å, and most preferably between about 200 Å and 500 Å.

In particular, a deposited titanium thickness of about 350 Å (i.e., the thickness formed on top of the insulating layer 204), with a via created with a mask opening of about 0.53 μm (resulting in about a 0.63 μm contact region 206A after the preferred contact etch and post-opening physical etch) results in a thickness of TiAl$_x$ composite 208A within the via of about 400 Å to 600 Å. The same deposited thickness with a mask opening of about 0.63 μm leads to a composite layer 208A of about 650 Å to 850 Å. The same deposited thickness with a mask opening of about 0.72 μm leads to a composite layer 208A of about 1,400 Å. As this last thickness is greater than the desired amount, less than 350 Å should be deposited into a contact formed through a 0.72 μm mask opening.

It will be understood, of course, that the above-noted thicknesses will be affected by any deviations in the amount of titanium deposited and the size and shape of the via (which is affected by the contact etch and post-opening physical etch). In light of the present disclosure, however, the skilled artisan can determine the amount of titanium to deposit into a given via size/shape in order to produce the preferred thicknesses of titanium-aluminum composite 208A. Initially, the manufacturer prepares a number of sample wafers having contact vias formed in accordance with a desired circuit design. Through depositing titanium layers of various thicknesses, the skilled artisan can determine the appropriate deposition thickness which will result in 60 Å to 300 Å (and more preferably 70 Å to 180 Å) of titanium reaching the bottom or contact region of the via. Reacting this amount of titanium with the aluminum within the contact structure will result in a titanium-aluminum composite 208A which is thick enough to break up any aluminum oxide and thin enough to avoid the formation of keyholes or voids.

Figure 2F:
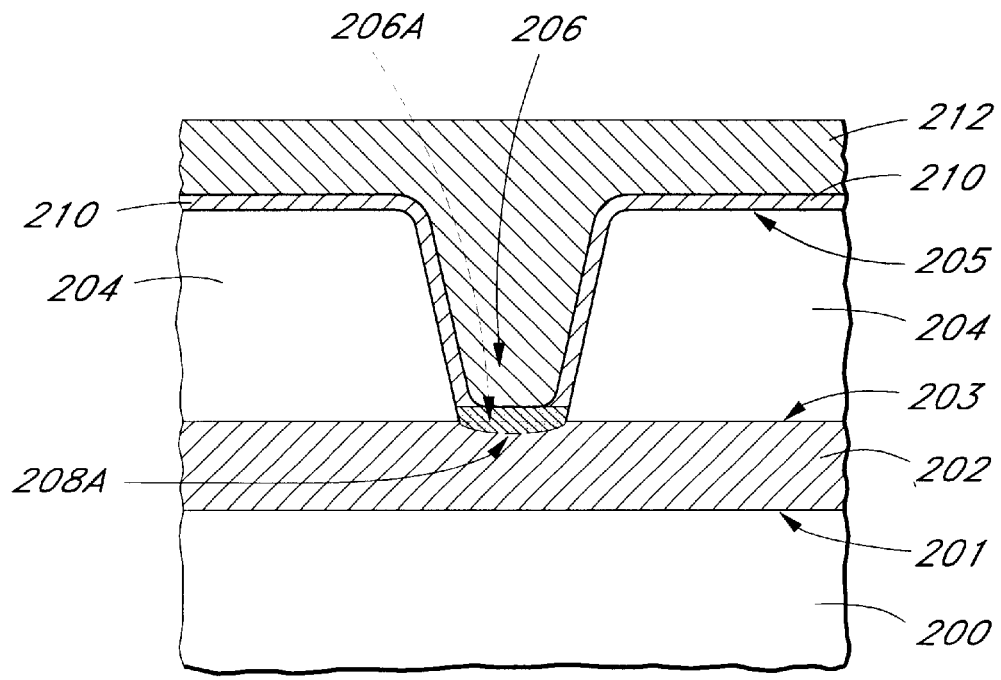
FIG. 2F is a schematic view of the wafer shown in FIG. 2D wherein a conductive layer has been deposited on the titanium layer and the composite layer.

As illustrated in FIG. 2F, a second conductive layer 212 is formed on the titanium layer 210 and the composite layer 208A. This second conductive layer 212, or metal-2, preferably comprises aluminum or an aluminum alloy, such as the 99.5% Al and 0.5% Cu alloy described above with respect to the aluminum layer 202. It will be understood by those having skill in the art, however, that the advantages disclosed herein will be equally applicable with metal-2 layers of alternative compositions. In particular, the second conductive layer can comprise overlayers of TiN/copper or TiN/aluminum. The second conductive layer 212 is electrically connected to the first aluminum layer 212 through the composite layer 208A at the contact region 206A.

It has been found that contact formed by use of the preferred processes presents many advantages. The process utilizes a lesser amount of titanium than conventional processes, thus reducing material costs for the fabrication. Furthermore, it has been found that the preferred thicknesses for the titanium layer 210 adequately reduce the electrical resistivity caused by oxide at the interface. At the same time, the preferred process does not result in voids within the contact, which excessive amounts of titanium have been found to cause.

Figure 3:
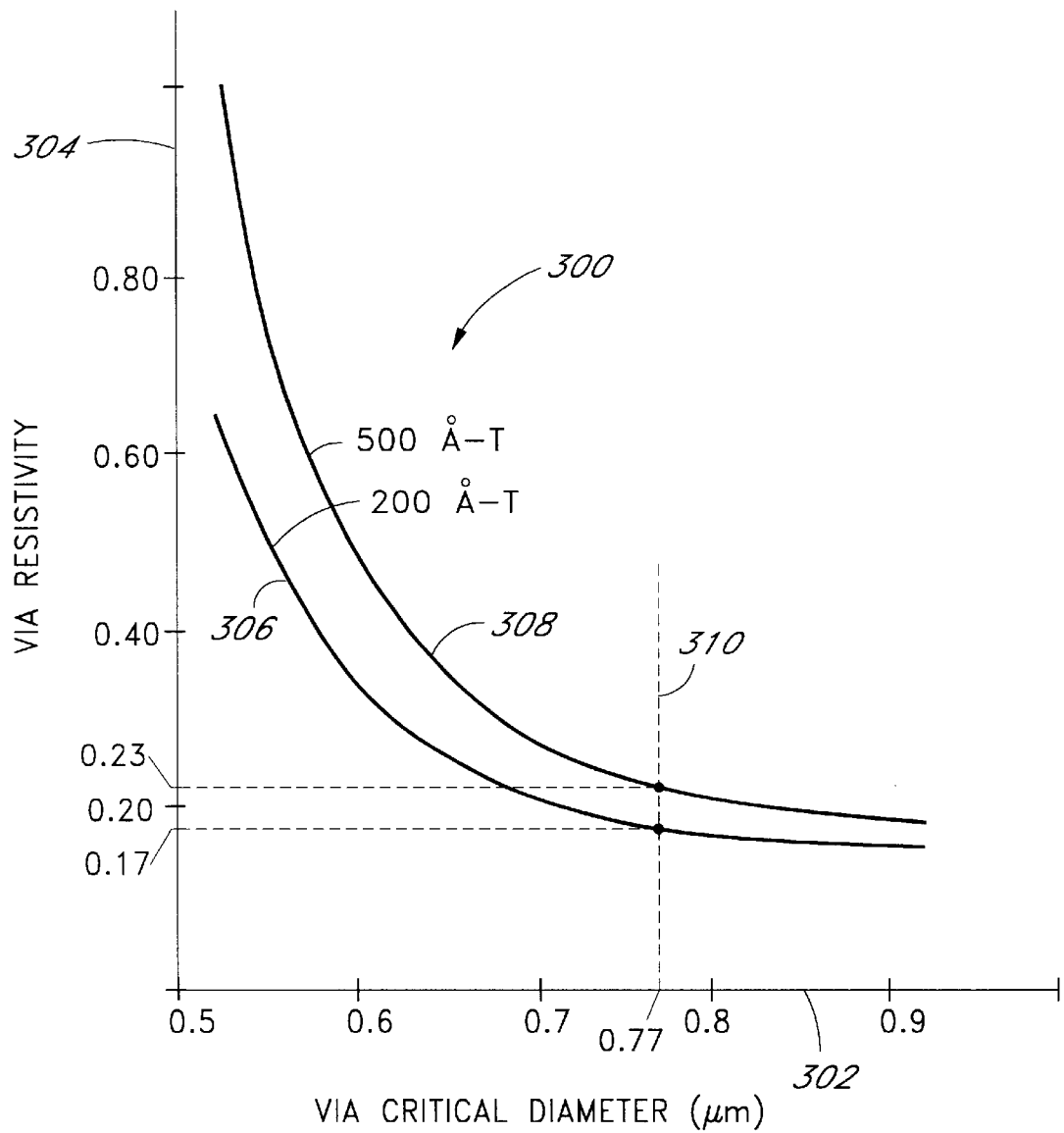
FIG. 3 is a graph comparing resistivity characteristics of the contacts of the using different thicknesses of titanium.

FIG. 3 graphically illustrates improved resistivity of the preferred contacts. Electrical resistivity is plotted against the critical dimension, or contact diameter, of various contacts. A first curve 306 represents the experimental data for a process depositing 200 Å of titanium over the insulating layer, while a second curve 308 represents contacts formed by depositing 500 Å of titanium over the insulating layer. As has been explained above, the deposited amounts result in lesser amounts of titanium which reach the bottom of a via formed in the insulating layer.

As is seen in the diagram 300, depositing 200 Å titanium results in a contact which exhibits lower electrical resistivity values over the entire range of contact dimensions. For a via formed with a 0.77 μm mask opening, depositing 200 Å of titanium over the insulating layer obtained about 0.17 Ω contact resistance, as compared to about 0.23 Ω contact resistance obtained by depositing 500 Å of titanium for the same critical dimension. Similar reductions in resistivity have been found for processes depositing 300–400 Å of titanium over the insulating layer when the vias are created by mask openings under 0.75 μm.

Although the foregoing description has shown, described and pointed out the fundamental novel features of the invention in the context of a particular preferred embodiment, it will be understood that various omissions, substitutions, and changes in the form of the detail of the apparatus and method as illustrated as well as the uses thereof, may be made by those skilled in the art, without departing from the spirit of the present invention. Consequently, the scope of the present invention is not intended to be limited to the foregoing discussions, but is instead defined by the appended claims.

We claim:

1. A process for forming low resistance contacts between conducting lines in an integrated circuit, comprising:

forming a first metallic layer over a semiconductor substrate, said metallic layer having a first surface, wherein said first metallic layer comprises an aluminum layer and said first surface includes an aluminum oxide;

forming an insulating layer over the first surface;

forming a patterned mask over said insulating layer, the patterned mask defining an opening having a width of less than about 0.75 μm;

forming a contact via in said insulating layer through the opening in said patterned mask to expose a contact region of the first surface;

removing said patterned mask;

depositing a titanium layer over said insulating layer and into said contact via, said titanium layer having a thickness over the insulating layer between about 300 Å and 400 Å; and reacting said titanium layer with said aluminum layer to form a titanium-aluminum complex, wherein the titanium-aluminum complex has a thickness between about 200 Å and 600 Å.

2. A process for forming low resistance contacts between conducting lines in an integrated circuit, comprising:

forming a first metallic layer over a semiconductor substrate, said metallic layer having a first surface, wherein said first metallic layer comprises an aluminum layer and said first surface includes an aluminum oxide;

forming an insulating layer over the first surface;

forming a patterned mask over said insulating layer, the patterned mask defining an opening having a width of less than about 0.75 μm;

forming a contact via in said insulating layer through the opening in said patterned mask to expose a contact region of the first surface;

removing said patterned mask;

depositing a titanium layer over said insulating layer and into said contact via, said titanium layer having a thickness over the insulating layer between about 300 Å and 400 Å; and reacting said titanium layer with said aluminum layer to form a titanium-aluminum complex.

3. The process of claim 2, wherein said aluminum layer comprises copper.

4. The process of claim 2, wherein depositing said titanium layer comprises physical vapor depositing titanium.

5. The process of claim 4, wherein depositing said titanium layer comprises sputter depositing titanium.

6. The process of claim 2, wherein the opening in said patterned mask has a width of less than about 0.65 μm.

7. The process of claim 6, wherein the opening in said patterned mask has a width of less than about 0.55 μm.

8. The process of claim 2, wherein the contact region has a width less than about 0.76 μm.

9. The process of claim 8, wherein the contact region has a width less than about 0.66 μm.

10. The process of claim 2, further comprising depositing a conductive layer over the titanium layer and into the contact via.

11. The process of claim 2, wherein said titanium layer has a thickness over the insulating layer between about 325 Å and 375 Å.

12. The process of claim 2, wherein forming said contact via comprises forming sloped sidewalls within said insulating layer.

13. The process of claim 2, further comprising sputter etching after removing said patterned mask and before depositing said titanium layer.

14. The process of claim 13, wherein sputter etching removes between about 200 Å to 500 Å of the insulating layer.

15. The process of claim 13, wherein sputter etching comprises performing an argon plasma etch.

\* \* \* \* \*

UNITED STATES PATENT AND TRADEMARK OFFICE
CERTIFICATE OF CORRECTION

PATENT NO. : 6,759,324 B1
DATED : July 6, 2004
INVENTOR(S) : Howard E. Rhodes and Sanh Tang It is certified that error appears in the above-identified patent and that said Letters Patent is hereby corrected as shown below:

Title page,
Insert Item:
-- [73] Assignee: Micron Technology, Inc., Boise, ID (US) --

Signed and Sealed this

Twenty-first Day of September, 2004

JON W. DUDAS
*Director of the United States Patent and Trademark Office*